United States Patent
Bae et al.

(10) Patent No.: US 8,643,181 B2
(45) Date of Patent: Feb. 4, 2014

(54) INTEGRATED CIRCUIT PACKAGING SYSTEM WITH ENCAPSULATION AND METHOD OF MANUFACTURE THEREOF

(75) Inventors: JoHyun Bae, Seoul (KR); SeongHun Mun, Incheon (KR); SeungYun Ahn, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 300 days.

(21) Appl. No.: 12/730,989

(22) Filed: Mar. 24, 2010

(65) Prior Publication Data

US 2011/0233751 A1 Sep. 29, 2011

(51) Int. Cl.
- *H01L 23/52* (2006.01)
- *H01L 23/48* (2006.01)
- *H01L 29/40* (2006.01)

(52) U.S. Cl.
USPC ............. 257/738; 257/E23.021; 257/778; 257/787; 438/107; 438/124

(58) Field of Classification Search
USPC ........... 257/E21.529, E23.023, E23.116, 692, 257/738, 778–780, 787; 438/15, 123–127, 438/612–614, 617
See application file for complete search history.

(56) References Cited

U.S. PATENT DOCUMENTS

| | | |
|---|---|---|
| 6,119,335 A | 9/2000 | Park et al. |
| 6,405,431 B1 | 6/2002 | Shin et al. |
| 7,185,426 B1 | 3/2007 | Hiner et al. |
| 7,372,151 B1 * | 5/2008 | Fan et al. ...................... 257/738 |
| 7,633,765 B1 | 12/2009 | Scanlan et al. |
| 7,777,351 B1 * | 8/2010 | Berry et al. ................... 257/778 |
| 7,944,034 B2 * | 5/2011 | Gerber et al. ................. 257/686 |
| 7,960,827 B1 * | 6/2011 | Miller et al. .................. 257/712 |
| 8,012,797 B2 * | 9/2011 | Shen et al. .................... 438/107 |
| 8,080,446 B2 * | 12/2011 | Choi et al. .................... 438/109 |
| 8,093,697 B2 * | 1/2012 | Haba et al. .................... 257/678 |

* cited by examiner

*Primary Examiner* — Chris Chu
(74) *Attorney, Agent, or Firm* — Ishimaru & Associates LLP

(57) ABSTRACT

A method of manufacture of an integrated circuit packaging system includes: forming a rounded interconnect on a package carrier having an integrated circuit attached thereto, the rounded interconnect having an actual center; forming an encapsulation over the package carrier covering the rounded interconnect; removing a portion of the encapsulation over the rounded interconnect with an ablation tool; calculating an estimated center of the rounded interconnect; aligning the ablation tool over the estimated center; and exposing a surface area of the rounded interconnect with the ablation tool.

20 Claims, 6 Drawing Sheets

INTEGRATED CIRCUIT PACKAGING SYSTEM WITH ENCAPSULATION AND METHOD OF MANUFACTURE THEREOF

TECHNICAL FIELD

The present invention relates generally to an integrated circuit packaging system, and more particularly to a system for an integrated circuit packaging system with encapsulation.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a rounded interconnect on a package carrier having an integrated circuit attached thereto, the rounded interconnect having an actual center; forming an encapsulation over the package carrier covering the rounded interconnect; removing a portion of the encapsulation over the rounded interconnect with an ablation tool; calculating an estimated center of the rounded interconnect; aligning the ablation tool over the estimated center; and exposing a surface area of the rounded interconnect with the ablation tool.

The present invention provides an integrated circuit packaging system, including: a package carrier; an integrated circuit attached to the package carrier; a rounded interconnect on the package carrier, the rounded interconnect having an actual center and a surface area, the surface area having characteristics of being exposed by an ablation tool with the ablation tool aligned by an estimated position of the rounded interconnect and an estimated center of the rounded interconnect, the ablation tool having a tool center; and an encapsulation over the package carrier covering the rounded interconnect, a portion of the encapsulation over the rounded interconnect and having characteristics of being removed by the ablation tool.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
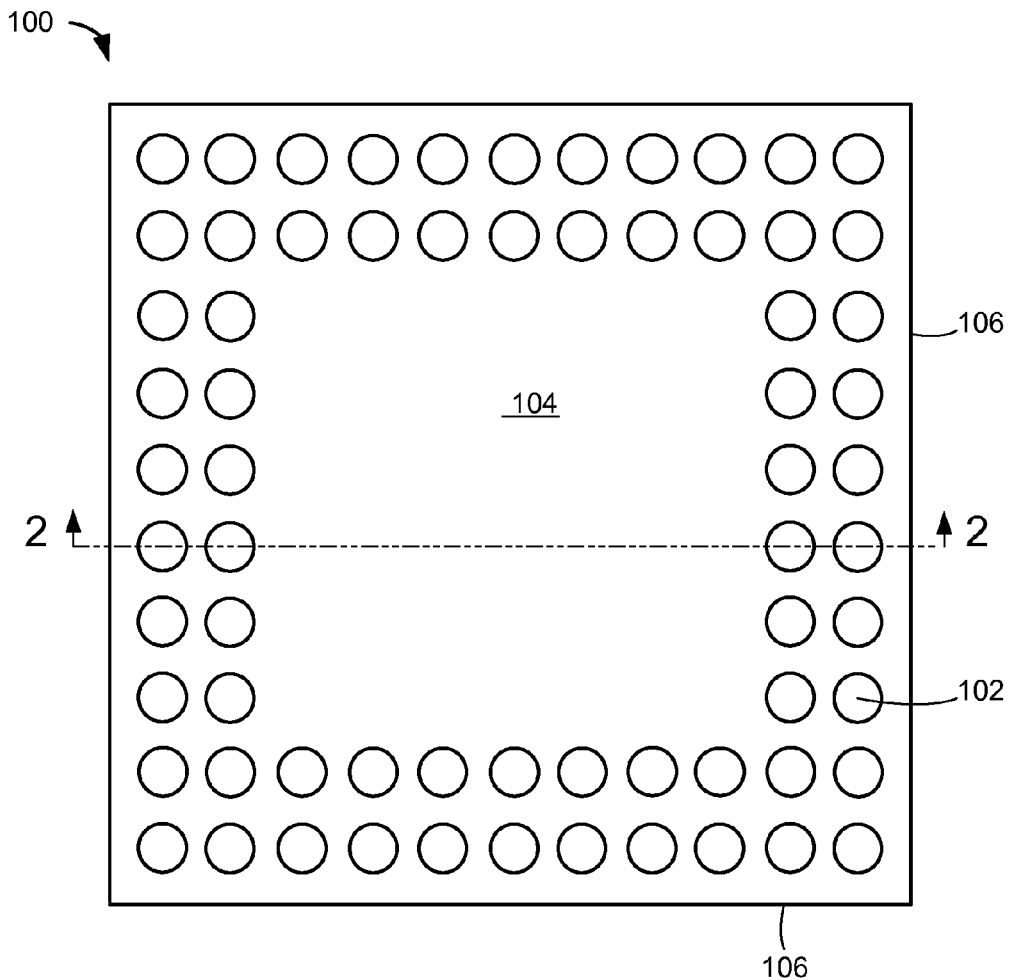
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can include a rounded interconnect 102, more specifically a conductive ball, a conductive bump, a conductive post, a conductive pillar, or a conductive connector.

The rounded interconnect 102 can be formed with solder, a metallic material, an alloy, or a conductive material, providing connectivity to other packaging systems. For example, the rounded interconnect 102 can be a top solder ball of a molded laser package-on-package (MLP) packaging system.

The rounded interconnect 102 can be exposed from an encapsulation 104, such as a cover including an encapsulant, an epoxy molding compound, or a molding material. The rounded interconnect 102 can be formed in an area array. The rounded interconnect 102 can be adjacent to sides 106 of the encapsulation 104.

Figure 2:
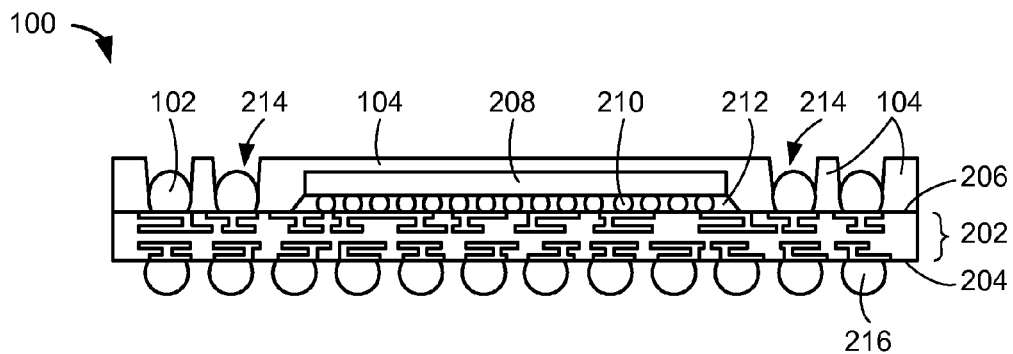
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The integrated circuit packaging system 100 can include a package carrier 202, such as a substrate, a leadframe, or a printed circuit board (PCB). The package carrier 202 can have a bottom side 204 and a top side 206 at an opposing side to the bottom side 204.

The integrated circuit packaging system 100 can include an integrated circuit 208, such as a flip chip, an integrated circuit die, or a semiconductor device, mounted over the package carrier 202. The integrated circuit 208 can be attached to the top side 206 with an internal interconnect 210, such as a ball, a bump, or a connector.

The internal interconnect 210 can be formed with solder, an alloy, or a conductive material. The integrated circuit packaging system 100 can include an underfill 212, such as an epoxy resin or any underfill resin material, dispensed in a space between the package carrier 202 and the integrated circuit 208 to protect the internal interconnect 210. The underfill 212 is on the integrated circuit 208 and is separated from the rounded interconnect 102.

The rounded interconnect 102 can be formed on the top side 206. The rounded interconnect 102 can be adjacent to the integrated circuit 208. The integrated circuit 208 can be surrounded by the rounded interconnect 102.

For example, the rounded interconnect 102 can be a post. Also for example, the rounded interconnect 102 can have a curved surface facing away from the package carrier 202 and a non-curved surface facing the package carrier 202.

The encapsulation 104 can be formed over the package carrier 202 covering the integrated circuit 208 and the underfill 212. The encapsulation 104 can partially cover the rounded interconnect 102.

The encapsulation 104 can include an opening 214, such as a hole or a cavity, partially exposing the rounded interconnect 102. The opening 214 can have a number of geometric shapes, such as a circle, an oval, an ellipse, or a rectangle.

The encapsulation 104 can isolate the rounded interconnect 102 from a further placement of the rounded interconnect 102. The rounded interconnect 102 is below the opening 214 of the encapsulation 104. For example, the opening 214 can be an ablated hole or a laser hole of a bottom package of a molded laser package-on-package (MLP) packaging system.

The integrated circuit packaging system 100 can include an external interconnect 216, more specifically a ball, a bump, or a connector, attached to the bottom side 204. The external interconnect 216 can be formed with solder, an alloy, or a conductive material, providing connectivity to external systems.

Figure 3:
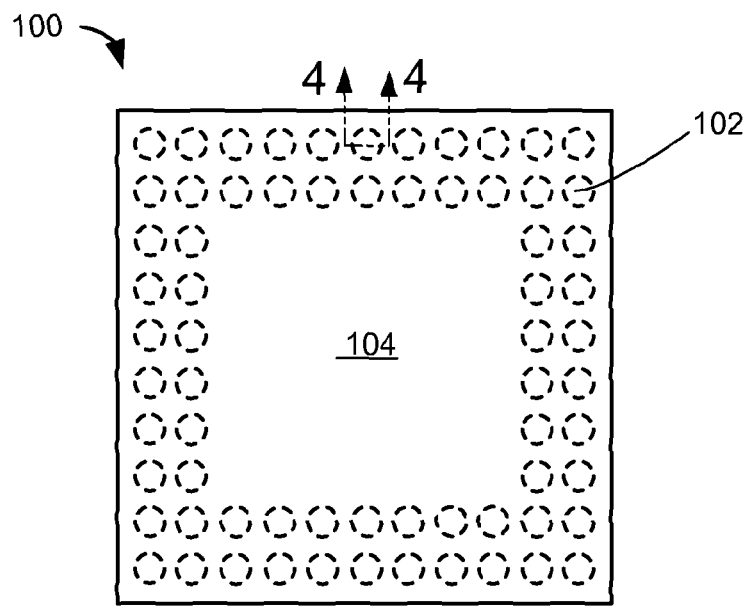
FIG. 3 is a top view of the integrated circuit packaging system in a molding phase of the encapsulation.

Referring now to FIG. 3, therein is shown a top view of the integrated circuit packaging system 100 in a molding phase of the encapsulation 104. The encapsulation 104 can be formed over the rounded interconnect 102. The top view depicts the rounded interconnect 102 shown as dashed circles.

Figure 4:
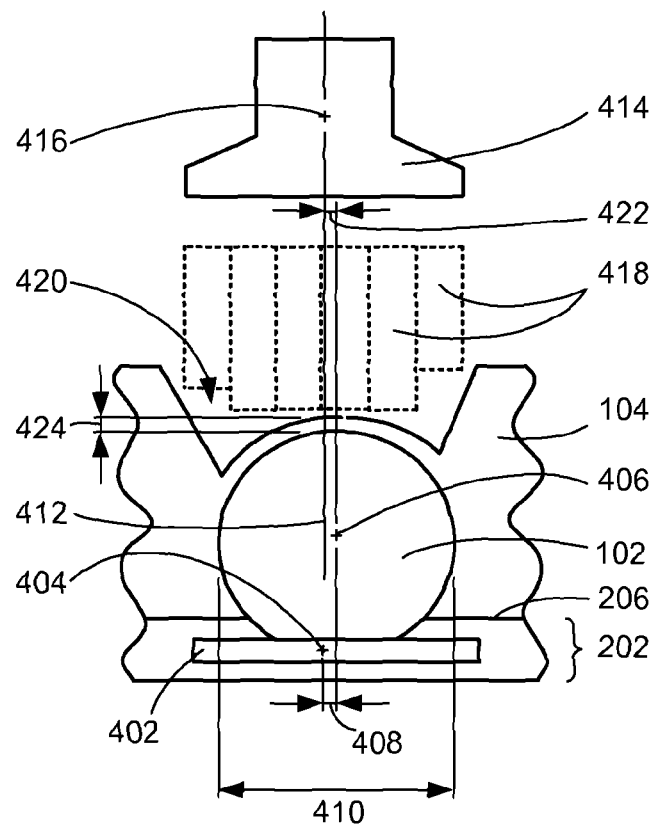
FIG. 4 is a cross-sectional view of a portion of the integrated circuit packaging system along a section line 4-4 of FIG. 3 in a first ablation phase of the encapsulation.

Referring now to FIG. 4, therein is shown a cross-sectional view of a portion of the integrated circuit packaging system 100 along a section line 4-4 of FIG. 3 in a first ablation phase of the encapsulation 104. The cross-sectional view depicts the encapsulation 104 covering the package carrier 202 and the rounded interconnect 102.

The package carrier 202 can include a pad 402, such as a terminal, a lead, or a contact. The pad 402 can be formed at the top side 206. The rounded interconnect 102 can be formed on the pad 402. The pad 402 can have a pad center 404.

The rounded interconnect 102 can have an actual center 406. The actual center 406 indicates the physical location of the rounded interconnect 102 after the rounded interconnect 102 is attached to the pad 402.

The figure for the first ablation phase can depict a location range 408, defined as limits of a horizontal distance between a vertical line that intersects the pad center 404 and another vertical line that intersects the actual center 406. The location range 408 can include limits within which the actual center 406 can be away from the pad center 404. The location range 408 can be predetermined based on machine accuracy or placement factors that affect the position of the rounded interconnect 102 on the pad 402.

The rounded interconnect 102 can have an interconnect size 410, defined as a distance from a point on a surface of the rounded interconnect 102 to another point on the surface. The location range 408 can be predetermined based on the interconnect size 410.

As an example, the interconnect size 410 can be a diameter of the rounded interconnect 102 or a longest horizontal distance between two points on the surface. As another example, the interconnect size 410 can approximately be 325 micrometers (um), and the location range 408 can approximately be from 0 micrometer to 50 micrometers.

The figure for the first ablation phase can depict an estimated position 412 of the rounded interconnect 102. The estimated position 412 can be calculated based on warpage, machine accuracy, a specific type of the package carrier 202, or placement of the rounded interconnect 102 on the pad 402.

The estimated position 412 indicates an approximate location of the rounded interconnect 102. The estimated position 412 can be an approximate location of the actual center 406. For illustrative purposes, the cross-sectional view depicts the pad center 404 with a cross mark in an interior portion of the pad 402.

The integrated circuit packaging system 100 can include a first ablation tool 414, which can be an equipment or a system that is used to remove a portion of the encapsulation 104 in the first ablation phase. The first ablation tool 414 can have a first tool center 416, shown as a cross mark in an interior portion of the first ablation tool 414.

The first ablation tool 414 can emit a number of first laser beams 418, which can be wide laser beams or electromagnetic radiation generated from a light source. The first ablation tool 414 can produce one or more of the first laser beams 418.

The first laser beams 418 can include various types of laser. The first laser beams 418 can be predetermined based on laser energy, exposure time, or laser characteristics. For example, the first laser beams 418 can preferably include infrared (IR) or other laser types, such as ultraviolet (UV), Green, yttrium aluminum garnet (YAG), neodymium-doped YAG (Nd—YAG), or carbon dioxide (CO2).

The first ablation tool 414 can be positioned over the encapsulation 104. The first ablation tool 414 can be aligned over the estimated position 412 by aligning the first tool center 416 over the estimated position 412.

The first tool center 416 can be aligned by positioning the first tool center 416 vertically aligned with the estimated position 412. The first ablation tool 414 can remove a portion of the encapsulation 104 that is over the rounded interconnect 102 with the first laser beams 418.

A first recess 420, such as a hole or a cavity, can be formed in the encapsulation 104 as a result of the portion of the encapsulation 104 removed. The rounded interconnect 102 can be partially exposed in the first recess 420 in the first ablation phase.

The figure for the first ablation phase can depict a misalignment range 422, defined as limits of a horizontal distance between the vertical line that intersects the actual center 406 and yet another vertical line that intersects the first tool center 416. The misalignment range 422 can be based on warpage, machine accuracy, or alignment factors that affect the first ablation tool 414 positioned over the encapsulation 104. The first ablation phase can have the encapsulation 104 ablated slightly offset to cause the first recess 420 to be misaligned with respect to the actual center 406 of the rounded interconnect 102, due to factors that can be related to warpage or machine accuracy.

As an example, the misalignment range 422 can be approximately 25% of the interconnect size 410. As another example, the interconnect size 410 can approximately be 325 micrometers, and the misalignment range 422 can approximately be from 0 micrometer to 65 micrometers.

The figure for the first ablation phase can depict a first depth range 424, defined as limits of a vertical distance between a horizontal line that intersects a top portion of the rounded interconnect 102 and another horizontal line that intersects a portion of the encapsulation that is exposed in the first recess 420. The first depth range 424 can indicate how much of the encapsulation 104 remained over the rounded interconnect 102 after the first ablation phase. As an example, the interconnect size 410 can approximately be 325 micrometers, and the first depth range 424 can approximately be from 10 micrometers to 30 micrometers.

For illustrative purposes, the actual center 406 is shown to be to the right of the pad center 404, although the actual center 406 can also be either vertically aligned with the pad center 404 or to the left of the pad center 404. Also for illustrative purposes, the first tool center 416 is shown to be to the left of the actual center 406, although the first tool center 416 can also be either vertically aligned with the actual center 406 or to the right of the actual center 406.

Further, for illustrative purposes, the encapsulation 104 is shown to be asymmetrically ablated, although the encapsulation 104 can also be symmetrically ablated. The asymmetrical ablation means that the encapsulation 104 is removed more to the left side than the right side of the actual center 406 because the first tool center 416 is to the left side of the actual center 406.

The asymmetrical ablation results in the encapsulation 104 removed more to the right side than the left side of the actual center 406 because the first tool center 416 is to the right side of the actual center 406. The symmetrical ablation means that the encapsulation 104 is removed evenly on both sides of the actual center 406 because the first tool center 416 is vertically aligned with the actual center 406.

Figure 5:
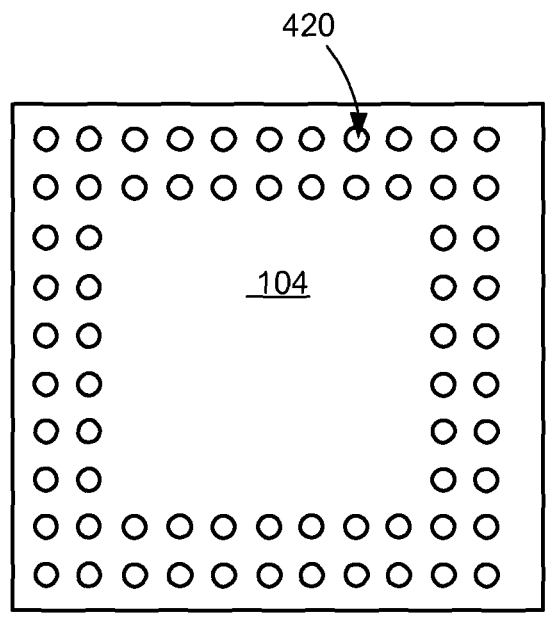
FIG. 5 is a top view of the integrated circuit packaging system in the first ablation phase.

Referring now to FIG. 5, therein is shown a top view of the integrated circuit packaging system 100 in the first ablation phase. The top view depicts the encapsulation 104 having the first recess 420. Based on the location range 408 of FIG. 4, the misalignment range 422 of FIG. 4, or a combination thereof, the first recess 420 can be misaligned with respect to the rounded interconnect 102 of FIG. 1.

Figure 6:
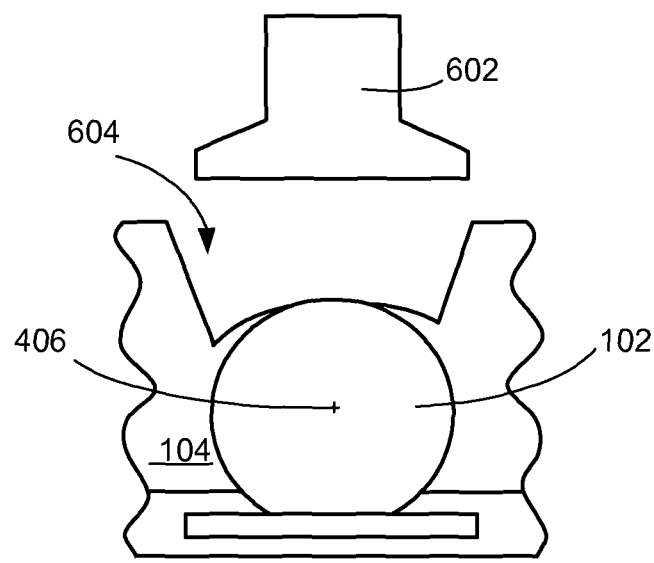
FIG. 6 is a cross-sectional view of the structure of FIG. 4 in a position compensation phase with a position recognition system.

Referring now to FIG. 6, therein is shown a cross-sectional view of the structure of FIG. 4 in a position compensation phase with a position recognition system 602. After the first ablation phase, the misalignment between a second recess 604 of the encapsulation 104 and the actual center 406 of the rounded interconnect 102 can occur.

The second recess 604 can be different from the first recess 420 of FIG. 4. The first recess 420 can be formed as the encapsulation 104 is being ablated in the first ablation phase. The second recess 604 can be formed at the end of the first ablation phase.

The misalignment problem can be resolved by position compensation with the position recognition system 602 (PRS). The position recognition system 602 can include methods or systems of finding or detecting the actual center 406 of the rounded interconnect 102. The position recognition system 602 can be positioned above the second recess 604.

Figure 7:
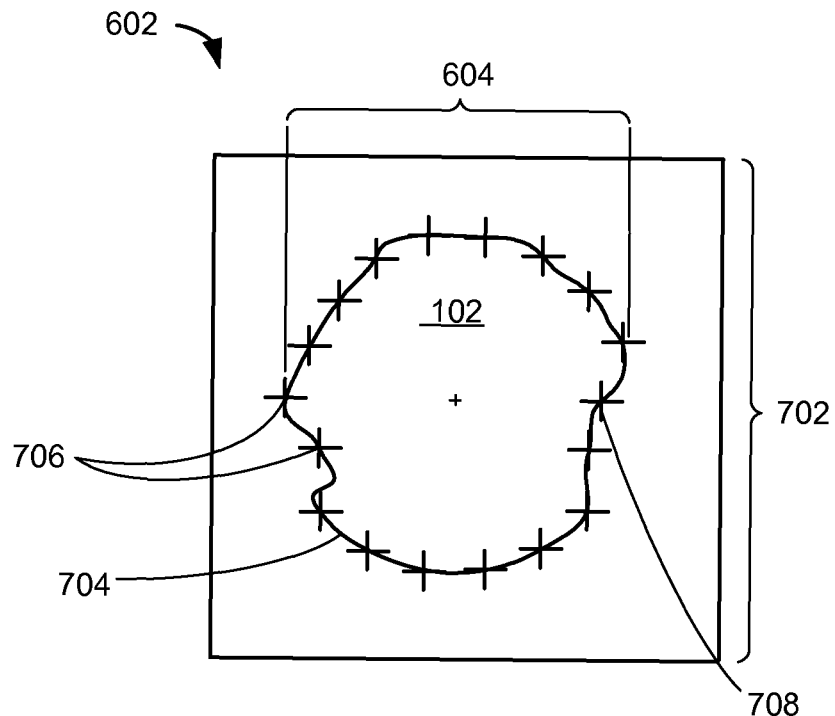
FIG. 7 is an ablation image of the rounded interconnect of FIG. 6 after the first ablation phase in a first step of the position recognition system.

Referring now to FIG. 7, therein is shown an ablation image 702 of the rounded interconnect 102 of FIG. 6 after the first ablation phase in a first step of the position recognition system 602. The ablation image 702 can include a top view of the second recess 604 of FIG. 6.

The ablation image 702 can be generated by image sensors, digital radiography, x-ray imaging, or other image processing techniques. The ablation image 702 can be used to capture an outline 704.

The outline 704 can be a detected boundary or an approximation of a circumference of the second recess 604. The outline 704 can also be a detected boundary or an approximation of a circumference of a portion of the rounded interconnect 102, which can be covered by the encapsulation 104 in the second recess 604.

The position recognition system 602 can detect N-points 706, which are locations on the outline 704. For illustrative purposes, the N-points 706 are shown as crosses or crosshairs on the outline 704.

The N-points 706 can be positioned at approximately equal intervals on the outline 704. For example, the position recognition system 602 can detect 18 of the N-points 706 that are 20 degrees from each other.

The number of degrees between the N-points 706 can be determined based on a circle (not shown) having a center that can be near or approximately the same as the actual center 406 in FIG. 6 and having a starting point 708 of the N-points 706 at one side of the circle.

Figure 8:
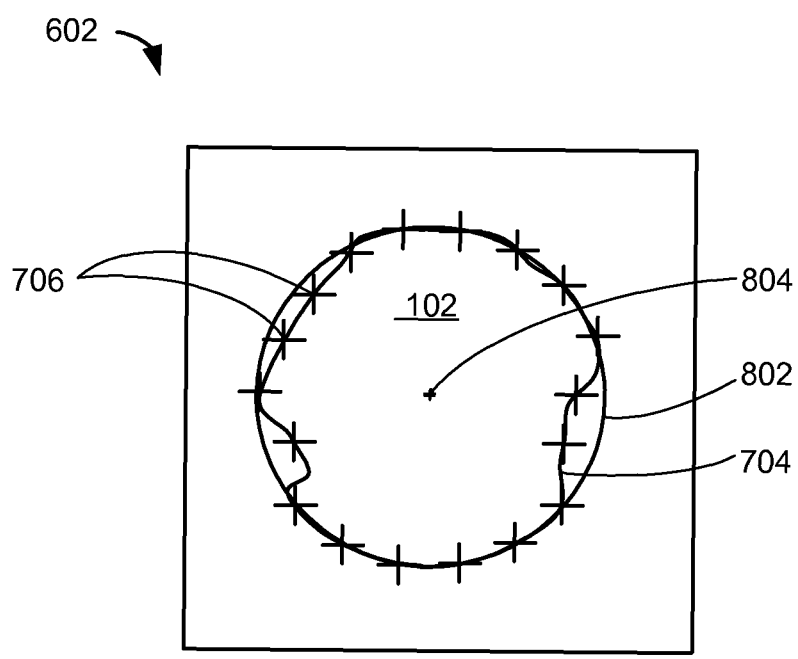
FIG. 8 is a best fit circle in a second step of the position recognition system.

Referring now to FIG. 8, therein is shown a best fit circle 802 in a second step of the position recognition system 602. The best fit circle 802 can be generated by the position recognition system 602 with the N-points 706.

The position recognition system 602 can generate the best fit circle 802 having a circumference that closely matches to that of the outline 704. In other words, the circumference of the best fit circle 802 can be on or closer to most of the N-points 706 than any other circles that are generated by the position recognition system 602 for purposes of finding a best match to the outline 704.

The position recognition system 602 can generate an estimated center 804 of the rounded interconnect 102. The estimated center 804 can be calculated based on the calculation of the center of the best fit circle 802.

The estimated center 804 can be an approximation of the actual center 406 of FIG. 4. The estimated center 804 can be more accurate than the estimated position 412 of FIG. 4. In other words, the estimated center 804 can be closer to the actual center 406 than the estimated position 412 to the actual center 406.

Figure 9:
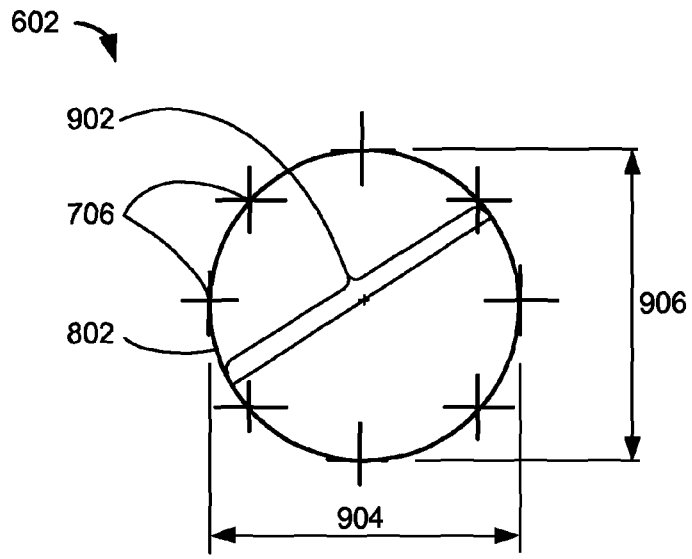
FIG. 9 is an estimated diameter of the rounded interconnect in a third step of the position recognition system.

Referring now to FIG. 9, therein is shown an estimated diameter 902 of the rounded interconnect 102 of FIG. 1 in a third step of the position recognition system 602. After the best fit circle 802 is formed, the estimated diameter 902 can be calculated by the position recognition system 602.

The estimated diameter 902 can be calculated by an average of distances of the N-points 706. The distances can be determined based on pairs of the N-points 706. One of the N-points 706 in the pair can be 180 degrees from another of the N-points 706 in the pair.

Each of the distances can be between the N-points 706 in the pair. The number of distances can be based on the number of the N-points 706. For example, the number of the N-points 706 and the number of the distances can be 18 and 9, respectively.

The estimated diameter 902 can be calculated by dividing a sum of the distances by the number of the distances. For example, the number of the distances can be nine, and the estimated diameter 902 can be a sum of nine of the distances divided by 9.

For illustrative purposes, there are two of the distances shown with a first distance 904 and a second distance 906, although there can be any number of the distances. Also for illustrative purposes, there are eight of the N-points 706 shown, although there can be any number of the N-points 706.

Figure 10:
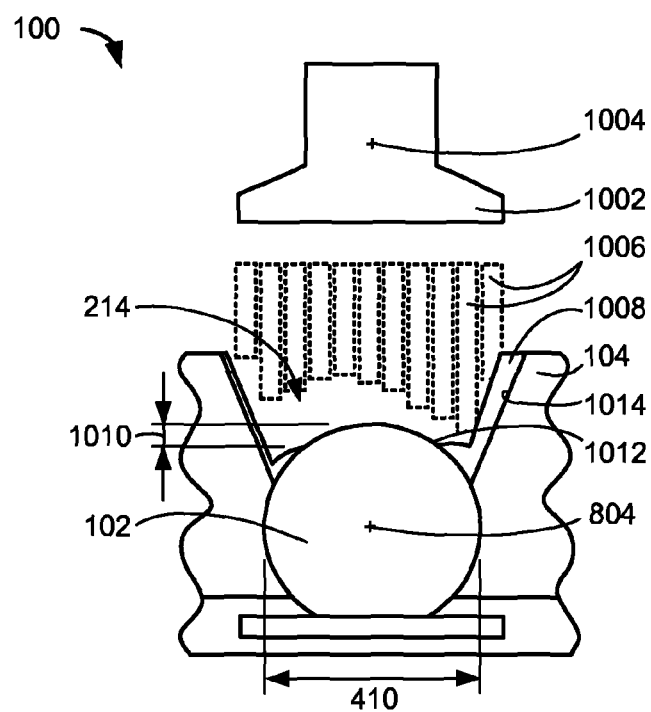
FIG. 10 is the structure of FIG. 6 in a second ablation phase of the encapsulation.

Referring now to FIG. 10, therein is shown the structure of FIG. 6 in a second ablation phase of the encapsulation 104. The second ablation phase can be performed after the position compensation is completed by the position recognition system 602 of FIG. 6.

The second ablation phase can include a second ablation tool 1002, which can be an equipment or a system that is used to remove an additional portion of the encapsulation 104 in the second ablation phase. The second ablation tool 1002 can have a second tool center 1004, shown as a cross mark in an interior portion of the second ablation tool 1002.

The second ablation tool 1002 can perform quality ablation beyond the first ablation tool 414 of FIG. 4 or fine surface treatment in the second recess 604 of FIG. 6, which can be the ablation area after the first ablation phase. The second ablation tool 1002 can emit a number of second laser beams 1006, which can be narrow laser beams or electromagnetic radiation generated from a light source.

The second ablation tool 1002 can produce one or more of the second laser beams 1006. The second ablation tool 1002 can have the second laser beams 1006 narrower than the first laser beams 418 of FIG. 4. For example, compared to the first laser beams 418, a beam width ratio of the second laser beams 1006 to the first laser beams 418 can approximately be 1 to 1.7.

The second laser beams 1006 can be predetermined based on laser energy, exposure time, or laser characteristics. For example, the second laser beams 1006 can preferably include ultraviolet (UV) or other laser types, such as infrared (IR), Green, yttrium aluminum garnet (YAG), neodymium-doped YAG (Nd—YAG), or carbon dioxide (CO2).

The second ablation tool 1002 can be positioned over the second recess 604 by vertically aligning the second tool center 1004 over the estimated center 804. The second ablation tool 1002 can remove a second portion 1008 of the encapsulation 104 that is over the rounded interconnect 102 in the second recess 604.

The opening 214 can be formed by removing the second portion 1008 in the second recess 604. The second portion 1008 can be remaining volume of the encapsulation 104 to be removed by the second ablation tool 1002 after automatic position compensation is completed by the position recognition system 602.

The second portion 1008 can be removed with the second laser beams 1006. The second laser beams 1006 can be controlled to span a horizontal distance that can be equal to the estimated diameter 902 of FIG. 9.

The figure for the second ablation phase can depict a second depth range 1010, defined as limits of a vertical distance between a horizontal line that intersects a top portion of the rounded interconnect 102 and another horizontal line that intersects a portion of the encapsulation that is exposed in the opening 214. The second depth range 1010 can indicate how much of the rounded interconnect 102 is exposed in the opening 214 after the second ablation phase. As an example, the interconnect size 410 can approximately be 325 micrometers, and the second depth range 1010 can approximately be from 0 micrometer to 20 micrometers.

Similar to the first ablation phase, the location range 408 of FIG. 4 can be applicable to the second ablation phase. For example, the interconnect size 410 can approximately be 325 micrometers (um), and the location range 408 can approximately be from 0 micrometer to 50 micrometers.

The rounded interconnect 102 and the encapsulation 104 can have a surface area 1012 and an opening side 1014, respectively. The surface area 1012 and the opening side 1014 can be exposed with the second ablation tool 1002.

The surface area 1012 and the opening side 1014 can be exposed by removing the second portion 1008 in the second recess 604. The surface area 1012 and the opening side 1014 can be exposed in the opening 214 after the second ablation phase. The surface area 1012 can be within the second depth range 1010.

The surface area 1012 or the opening side 1014 can have characteristics of the opening 214 formed. The characteristics of the opening 214 formed can include physical features, such as a shallow cavity, a recess, a micro recess, laser-ablated marks, or other removal marks.

For illustrative purposes, the integrated circuit packaging system 100 has been shown to include the first ablation tool 414 of FIG. 4, the position recognition system 602, and the second ablation tool 1002 as separate tools or systems, although the first ablation tool 414, the position recognition system 602, the second ablation tool 1002, or any combination thereof can be the same tool or system. For example, the integrated circuit packaging system 100 can include the first ablation tool 414 having functions of the first ablation tool 414, the position recognition system 602, and the second ablation tool 1002.

For comparison purposes of laser sources, a packaging system with the second ablation tool 1002, having ultraviolet (UV) laser type with a narrow beam size, can produce a low productivity level in terms of units per hour (UPH) and a best ablation quality. A packaging system with the first ablation tool 414, having infrared (IR) laser type with a wide beam size, can produce a high productivity level in terms of UPH and a good ablation quality. A packaging system with the first ablation tool 414 and the second ablation tool 1002 can produce a middle productivity level in terms of UPH and a good ablation quality.

The integrated circuit packaging system 100 can increase productivity by reducing the ablation time. For example, packaging systems having only ultraviolet (UV) laser type can have an ablation time of 55 seconds, and the integrated circuit packaging system 100 can have a lower ablation time of 28.5 second, based on a test vehicle of 240 holes/unit. As a result, the integrated circuit packaging system 100 can have an increase ratio of 192% compared to the packaging systems having only ultraviolet (UV) laser type.

Figure 11:
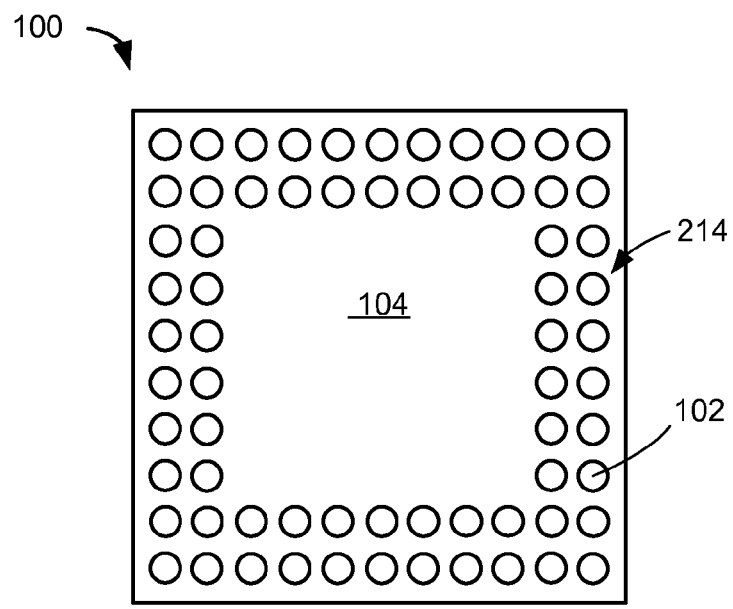
FIG. 11 is a top view of the integrated circuit packaging system in the second ablation phase.

Referring now to FIG. 11, therein is shown a top view of the integrated circuit packaging system 100 in the second ablation phase. The top view depicts the encapsulation 104 having the opening 214. With the automatic position compensation by the position recognition system 602 of FIG. 6 and the second ablation phase, the opening 214 can be aligned with or close to the rounded interconnect 102.

It has been discovered that the first ablation tool 414 of FIG. 4 and the second ablation tool 1002 of FIG. 10 improves productivity and quality in laser ablation. The productivity is improved by combining strong points of laser sources that can be applied to packaging systems with molded laser package-on-package (MLP) packages. With the first ablation tool 414 having wide laser beams, high productivity is achieved in terms of units per hour (UPH) due to short ablation times, and good ablation quality is achieved. However, ablation quality of the first ablation tool 414 is less compared to that of the second ablation tool 1002. With the second ablation tool 1002 having narrow laser beams, improved ablation quality is achieved, but a low productivity is achieved due to long ablation time. The second ablation tool 1002 produces better quality than the first ablation tool 414 because the second ablation tool 1002 has finer or more precise ablation quality. However, the second ablation tool 1002 requires a long time for laser ablation because the ablation frequency of the second ablation tool 1002 has to be increased in order to have narrow beam sizes. As a result, good laser ablation quality is achieved while maintaining middle productivity levels by selecting acceptable mixture of laser beams.

It has also been discovered that the position recognition system 602 significantly improves position accuracy of laser ablation. The position accuracy is significantly improved by re-aligning the second ablation tool 1002 based on the estimated center 804 of FIG. 8.

It has further been discovered that the position recognition system 602 having position compensation and the second ablation tool 1002 improves reliability. The reliability is provided by with the estimated center 804 generated by the position recognition system 602 and the opening 214 of FIG. 2 formed by the second ablation tool 1002. The reliability applies to packaging systems, having package-on-package (PoP) structures with high input/output (I/O) counts and small ball pitches in limited surface areas. Such packaging systems are allowed to connect top packages to bottom packages by the rounded interconnect 102 of FIG. 1 that is properly exposed in the opening 214, thereby eliminating problems due to solder bridges, insufficient package clearance, or poor package joints. As a result, the rounded interconnect 102 is allowed to have a finer ball pitch.

Figure 12:
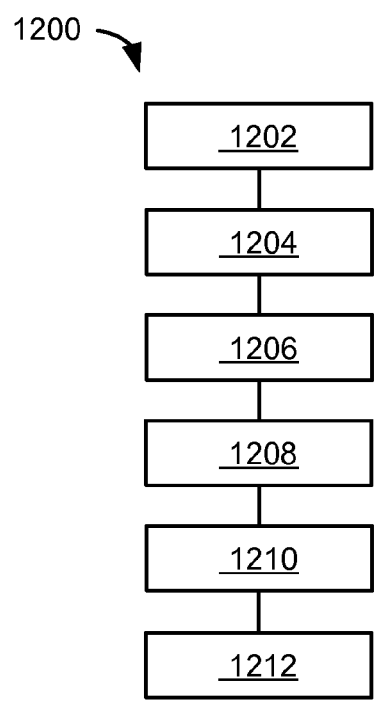
FIG. 12 is a flow chart of a method of manufacture of the integrated circuit packaging system in a further embodiment of the present invention.

Referring now to FIG. 12, therein is shown a flow chart of a method 1200 of manufacture of the integrated circuit packaging system in a further embodiment of the present invention. The method 1200 includes: forming a rounded interconnect on a package carrier having an integrated circuit attached thereto, the rounded interconnect having an actual center in a block 1202; forming an encapsulation over the package carrier covering the rounded interconnect in a block 1204; removing a portion of the encapsulation over the rounded interconnect with an ablation tool in a block 1206; calculating an estimated center of the rounded interconnect in a block 1208; aligning the ablation tool over the estimated center in a block 1210; and exposing a surface area of the rounded interconnect with the ablation tool in a block 1212.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
forming a rounded interconnect on a package carrier having an integrated circuit attached thereto, the rounded interconnect having an actual center and separated from an underfill on the integrated circuit;
forming an encapsulation over the package carrier covering the rounded interconnect;
removing a portion of the encapsulation over the rounded interconnect with an ablation tool;
calculating an estimated center of the rounded interconnect;
aligning the ablation tool over the estimated center, the estimated center offset from an actual center of the rounded interconnect; and
exposing a surface area of the rounded interconnect with the ablation tool.

2. The method as claimed in claim 1 wherein calculating the estimated center includes generating an outline of the rounded interconnect.

3. The method as claimed in claim 1 wherein calculating the estimated center includes:
generating an outline of the rounded interconnect; and
generating a best fit circle closely matched to the outline.

4. The method as claimed in claim 1 wherein forming the rounded interconnect includes forming the rounded interconnect on a pad of the package carrier, the actual center away from a pad center of the pad based on a location range between the actual center and the pad center.

5. The method as claimed in claim 1 wherein exposing the surface area includes exposing the surface area within a depth range of the encapsulation.

6. A method of manufacture of an integrated circuit packaging system comprising:
forming a rounded interconnect on a package carrier having a pad thereof and an integrated circuit attached thereto, the rounded interconnect having an actual center and separated from an underfill on the integrated circuit;
forming an encapsulation over the package carrier covering the rounded interconnect;
aligning a first ablation tool over an estimated position of the rounded interconnect, the first ablation tool having a tool center;
removing a portion of the encapsulation over the rounded interconnect with the first ablation tool;
calculating an estimated center of the rounded interconnect;
aligning a second ablation tool over the estimated center, the estimated center offset from an actual center of the rounded interconnect; and
exposing a surface area of the rounded interconnect with the second ablation tool.

7. The method as claimed in claim 6 wherein calculating the estimated center includes generating an outline of the rounded interconnect, the outline having N-points at approximately equal intervals.

8. The method as claimed in claim 6 wherein calculating the estimated center includes:
generating an outline of the rounded interconnect, the outline having N-points at approximately equal intervals; and
generating a best fit circle closely matched to the outline.

9. The method as claimed in claim 6 wherein forming the rounded interconnect includes forming the rounded interconnect on the pad, the actual center away from a pad center of the pad within a location range.

10. The method as claimed in claim 6 wherein aligning the second ablation tool includes aligning the second ablation tool over the estimated center, the second ablation tool having a laser beam with a ratio of approximately 1 to 1.7 compared to that of the first ablation tool.

11. An integrated circuit packaging system comprising:
a package carrier;
an integrated circuit attached to the package carrier;
an underfill on the integrated circuit;
a rounded interconnect on the package carrier and separated from the underfill; and
an encapsulation over the package carrier covering the rounded interconnect, the encapsulation having an opening aligned to an estimated center of the rounded interconnect, the estimated center offset from an actual center of the rounded interconnect.

12. The system as claimed in claim 11 wherein the encapsulation isolates the rounded interconnect from a further rounded interconnect.

13. The system as claimed in claim 11 wherein the encapsulation is over the integrated circuit.

14. The system as claimed in claim 11 wherein:
the package carrier includes a pad;
the rounded interconnect, having an actual center, is on the pad, the actual center away from a pad center of the pad based on a location range between the actual center and the pad center.

15. The system as claimed in claim 11 wherein the rounded interconnect has a surface area exposed within a depth range of the encapsulation.

16. The system as claimed in claim 11 wherein the package carrier includes a pad.

17. The system as claimed in claim 16 wherein:
the encapsulation having the opening; and
the rounded interconnect is below the opening.

18. The system as claimed in claim 16 wherein the rounded interconnect has a curved surface facing away from the package carrier.

19. The system as claimed in claim 16 wherein the rounded interconnect, having an actual center, is on the pad, the actual center away from a pad center of the pad within a location range.

20. The system as claimed in claim 16 wherein the encapsulation covers the integrated circuit.

* * * * *